United States Patent [19]

Malhi et al.

[11] Patent Number: 5,382,535
[45] Date of Patent: Jan. 17, 1995

[54] METHOD OF FABRICATING PERFORMANCE LATERAL DOUBLE-DIFFUSED MOS TRANSISTOR

[75] Inventors: Satwinder Malhi, Garland; Wai T. Ng, Plano, both of Tex.

[73] Assignee: Texas Instruments Incorporated, Dallas, Tex.

[21] Appl. No.: 213,887

[22] Filed: Mar. 16, 1994

Related U.S. Application Data

[60] Division of Ser. No. 976,713, Nov. 16, 1992, Pat. No. 5,304,827, which is a continuation of Ser. No. 776,102, Oct. 15, 1991, abandoned.

[51] Int. Cl.⁶ .................................... H01L 21/265
[52] U.S. Cl. .................................... 437/40; 437/27; 437/152; 437/154; 437/157
[58] Field of Search ............... 437/40, 27, 30, 154, 437/157, 152, 953; 257/336, 339, 343, 344, 408, 409, 262

[56] References Cited

U.S. PATENT DOCUMENTS

| | | |
|---|---|---|
| 4,394,674 | 7/1983 | Sakuma et al. |
| 4,614,959 | 9/1986 | Nakagawa |
| 4,757,362 | 7/1988 | Biwa et al. |
| 4,819,045 | 4/1989 | Murakami |
| 4,912,053 | 3/1990 | Schrantz ............... 437/29 |
| 4,947,232 | 8/1990 | Ashida et al. |
| 4,966,858 | 10/1990 | Masquelier et al. ........ 437/27 |
| 5,055,896 | 10/1991 | Williams et al. |

FOREIGN PATENT DOCUMENTS

| | | |
|---|---|---|
| 0114435 | 8/1984 | European Pat. Off. |
| 56-54071 | 5/1981 | Japan .................. 357/23.8 |
| 56-70662 | 6/1981 | Japan .................. 357/23.8 |
| 56-160072 | 12/1981 | Japan .................. 357/23.8 |
| 57-59383 | 4/1982 | Japan . |
| 57-106165 | 7/1982 | Japan . |
| 58-89866 | 5/1983 | Japan . |
| 61-79260 | 4/1986 | Japan .................. 357/23.8 |
| 2-102575 | 4/1990 | Japan . |
| 2-102577 | 4/1990 | Japan .................. 357/23.8 |

OTHER PUBLICATIONS

"High Voltage Thin Layer Devices (Resurf Devices)", J. A. Appels and H. M. J. Vaes, *IEEE*, 1979, pp. 238–241.

"Extremely High Efficient UHF Power MOSFET for Handy Transmitter", Itoh et al., International Electron Meeting 1983, Washington, D.C., Dec. 5-6-7 Technical Digest, pp. 95–98.

*Primary Examiner*—George Fourson
*Assistant Examiner*—David M. Mason
*Attorney, Agent, or Firm*—W. James Brady, III; Richard L. Donaldson

[57] ABSTRACT

A transistor has a JFET gate region of a first conductivity type formed at the face of a semiconductor layer to laterally and downwardly surround a drift region of a second conductivity type. A thick insulator region is formed on a portion of the drift region at the face. A IGFET body of the first conductivity type is formed at the face to be adjacent the JFET gate region. This body spaces a source region of the second conductivity type from the drift region. A drain region is formed at the face to be of the second conductivity type and to adjoin the drift region, and to be spaced from the IGFET body. A conductive gate extends over the face between the source region and the thick insulator region, with a thin gate insulator spacing the gate from the IGFET body. The enhanced doping concentration of the JFET gate region with respect to the semiconductor layer allows the dopant concentration of the drift region to likewise be increased, thereby allowing RESURF conditions to be met at the rated voltage and with a lower $r_{ds}(on)$.

4 Claims, 2 Drawing Sheets

METHOD OF FABRICATING PERFORMANCE LATERAL DOUBLE-DIFFUSED MOS TRANSISTOR

This is a division of application Ser. No. 07/976,713, filed No. 16, 1992, now U.S. Pat. No. 5,304,821, which is a continuation of application Ser. No. 07/776,102, filed Oct. 15, 1991, now abandoned.

TECHNICAL FIELD OF THE INVENTION

This invention relates in general to electronic power devices, and more particularly to a lateral double-diffused insulated gate field effect transistor and a process for its fabrication.

BACKGROUND OF THE INVENTION

Lateral double-diffused insulated gate field effect transistors (sometimes known as LDMOS transistors) are the power devices of choice for integration into very large scale integrated circuit (VLSI) logic processes. The on-resistance per unit area ($r_{ds}$(on)) is the figure of merit for a high voltage power device. Reduced surface field (RESURF) power transistors were introduced by J. A. Appels and H. M. J. Vaes in "*High Voltage Thin Layer Devices (Research Devices)*", *IDEM Tech. Dig.* 1979, pp. 238-241. A RESURF LDMOS device will have, given a (P) type semiconductor substrate, an N-type drift region that surrounds an (N+) drain. Relatively thick LOCOS oxide is grown on a portion of the drift region. A relatively deep (P) type implant is used to make the body of the insulated gate field-effect transistor (IGFET), which spaces the drift region from a source region. A (P+) back gate connection is formed within the (P) body implant region. A conductive gate is formed over and insulated from the IGFET body to extend from the source region over the body to the lateral margin of the LOCOS oxide, and preferably extends onto a portion of this thicker oxide.

The drift region has a donor dopant concentration $N_{D1}$, which is designed to fully deplete with the JFET action from the (P-) substrate gate at the rated voltage. However, the JFET gate dopant concentration is optimized for use of the substrate for other VLSI devices, and is suboptimal for a high voltage power device. A need exists to develop an LDMOS transistor having a low $r_{ds}$(on) that is yet compatible with VLSI logic processes.

SUMMARY OF THE INVENTION

According to one aspect of the invention, a transistor having a large breakdown voltage and adaptable to carry a large amount of current is formed at a face of a semiconductor layer having a first conductivity type. This transistor includes a JFET gate region of the first conductivity type formed in the semiconductor layer, where the dopant concentration of the JFET gate region is substantially higher than that of the background dopant concentration of the semiconductor layer. A drift region of a second conductivity type is formed to be laterally within the JFET gate region. A thick insulator region is formed at the face on at least a portion of the drift region. An insulated-gate field effect transistor (IGFET) body of the first conductivity type is formed adjacent the JFET gate region. A source region of the second conductivity type is formed to be laterally within the body and spaced from the drift region. A drain region is formed to be of the second conductivity type and to adjoin the drift region and be spaced from the body. A back gate connection region is formed at the face to be of the first conductivity type and to adjoin the body. A conductive gate extends over the face at least between the source region and the thick insulator region, with a thin gate insulator spacing the gate from the body. Preferably, the conductive gate further extends over a portion of the thick insulator region.

According to a further aspect of the invention, the JFET gate region and the drift region are formed using the same hard mask with successive implants. In a subsequent diffusion drive-in, the dopant of the first conductivity type, which has a much higher diffusion constant than the dopant of the second conductivity type, diffuses further into the semiconductor layer, creating a JFET gate region which laterally and downwardly surrounds the drift region. A masking step can also be saved in the formation of the IGFET body and the source region. The same mask can be used to implant both of these regions; with a subsequent diffusion drive-in, dopant atoms of the first conductivity type diffuse outwardly at a faster rate than the dopant atoms of the second conductivity type, which are selected to have a lower diffusion constant. In this way, the body laterally surrounds the source region, and preferably overlaps the dopant limits of the JFET gate region. A back gate connection is preferably subsequently implanted into the body so as to be in ohmic contact with the JFET gate region.

An important technical advantage of the invention in its provision of the JFET gate region with dopant concentration that is enhanced over that of the semiconductor layer. Due to the more highly doped JFET gate region, the drift region doping can also be increased while still meeting the RESURF conditions. This will lower the drift region resistance, leading to a lower $r_{ds}$(on) for the device. A further technical advantage of the invention is its compatibility with a VLSI logic process in which other, lower-power devices are made simultaneously in the same chip. Only one additional mask is needed to fabricate this device in addition to the others normally encountered in a VLSI logic process.

BRIEF DESCRIPTION OF THE DRAWINGS

Further aspects of the invention and their advantages will be discerned by referring to the following detailed description in conjunction with the drawings, in which like parts are identified with like characters and in which.

DETAILED DESCRIPTION OF THE INVENTION

Figure 1:
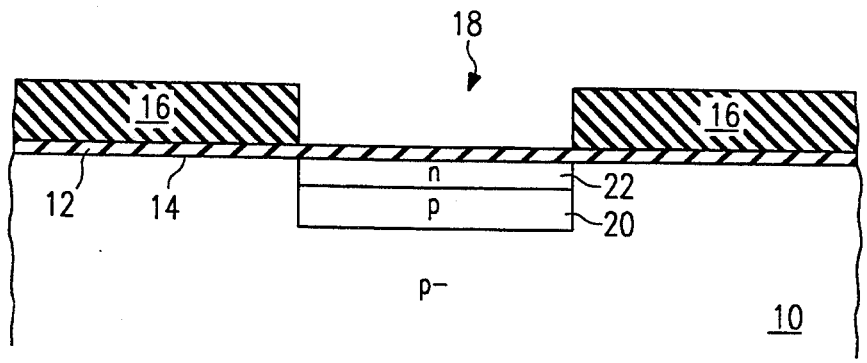
FIGS. 1-5 are highly magnified schematic sectional views of a mirror pair of LDMOS transistors according to the invention, showing successive stages in their fabrication.

Referring first to FIG. 1, a (P-) semiconductor substrate is indicated generally at 10. Layer 10 may De an epitaxial layer having a resistance in the range of 25 to 33 ohm-cm. A sacrificial layer 12 of oxide is grown on a face 14 of the semiconductor layer 10. Layer 12 may be approximately 400 Angstroms thick. A layer 16 of photoresist is deposited on the oxide 12 and is developed to define a first implantation area indicated generally at 18. The developed photoresist layer 16 is used as a mask for two implants of different conductivity types.

First, a (P) type dopant such as boron is implanted into area 18 at an implantation energy of approximately 100 KeV. The dose may be in the range of $5 \times 10^{12}$ atoms/cm$^2$ to $2 \times 10^{13}$ atoms/cm$^2$. This creates a (P) region 20.

Using the same mask, a second implant is performed this time using an (N) type dopant having a substantially lower diffusivity than the (P) type dopant employed. In the preferred embodiment, arsenic is used with an implantation energy of approximately 80 KeV and a dose in the range of $5 \times 10^{12}$ to $2 \times 10^{13}$ atoms/cm$^2$. This creates an (N) type region 22 that is shallower than the region 20. The region 20 will have a dopant concentration which is substantially higher than the background dopant concentration of the (P-) semiconductor layer 10.

Figure 2:
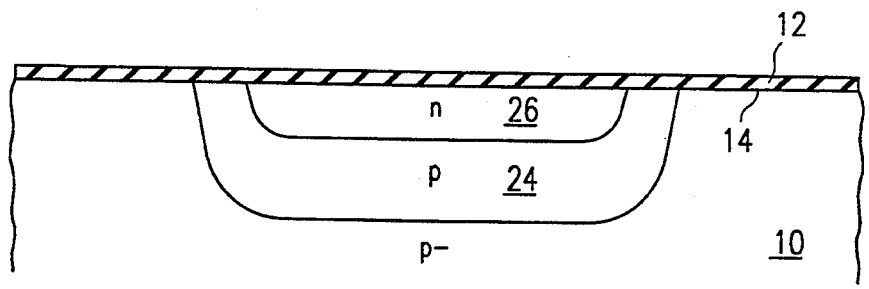

Referring next to FIG. 2, the photoresist layer 16 is stripped and the implants 20 and 22 are driven in to produce a (P) JFET gate region 24 and an (N) drift region 26. The diffusion drive-in may take place, for example, at 1200° C. for approximately 700 minutes. The higher diffusivity of the (P) type dopant causes the dopant to diffuse outwardly at a faster rate than the arsenic atoms used to create the drift region 26. This in turn results in the JFET gate region 24 laterally and downwardly enclosing the (N) drift region 26.

Figure 3:
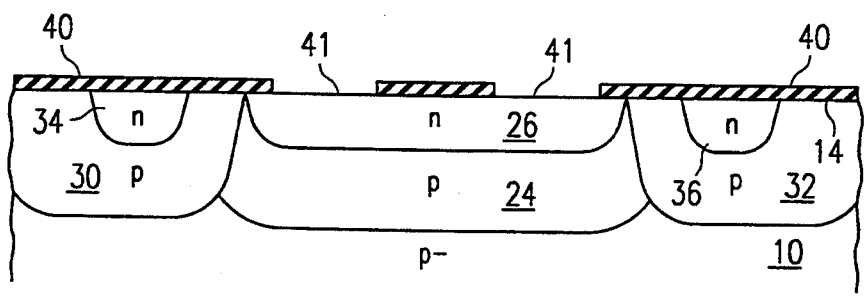

Referring next to FIG. 3, the results of a second set of implantations are shown. A second layer of photoresist (not shown) is deposited and developed to leave open second implantation areas (not shown). A second set of implants is then performed, each using the second developed photoresist mask. A first of these implants is with a high diffusivity, (P) dopant such as boron. The dose should fall within the range of $1.5 \times 10^{13}$ atoms/cm$^2$ to $1.5 \times 10^{14}$ atoms/cm$^2$ and is preferably about $5 \times 10^{13}$ atoms/cm$^2$. The implantation energy may be approximately 100 KeV. Second, a relatively low-diffusivity (N) type dopant such as arsenic is implanted. The dose for this species can range from $3 \times 10^{13}$ through $2 \times 10^{14}$ and is preferably about $1 \times 10^{14}$ atoms/cm$^2$. A preferred implantation energy is 120 KeV.

Next, a drive-in step is performed, such as one at approximately 1100° C. for 500 minutes. This will produce insulated gate field effect transistor (IGFET) bodies 30 and 32 as respectively surrounding source regions 34 and 36. The IGFET bodies 30 and 32 intentionally overlap the JFET gate region 24. The top of the IGFET region 30 will serve as the channel region of a field effect transistor to be fabricated between source region 34 and the drift region 26, while the top of the IGFET body 32 likewise serves as the channel region for a field effect transistor to be formed between the drift region 26 and source region 36.

After these diffusion drive-ins, a pad oxide layer (not shown) is grown on the surface 14 of the semiconductor layer 10 and a nitride layer is subsequently deposited to together form a hard mask 40. Mask 40 is patterned and etched to leave windows 41 for the subsequent LOCOS thick oxide growth process step to be described immediately below.

Figure 4:
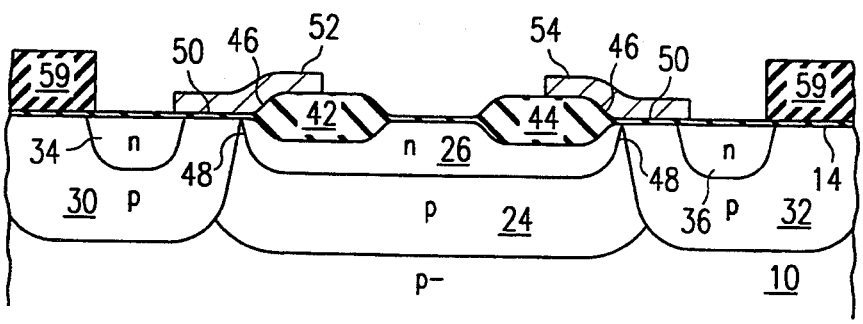

Turning to FIG. 4, LOCOS oxide islands 42 and 44 are grown under an oxygen atmosphere to a preferred thickness of about 7600 Angstroms. Each of the LOCOS oxide islands 42 and 44 has "bird's beak" lateral margins 46 which are near the lateral margins 48 of the drift region 26. Next, a gate oxide layer 50 is grown on the surface 14 of the semiconductor layer to a total thickness of approximately 500 Angstroms under an oxygen/steam atmosphere. After this, approximately 4500 Angstroms of polycrystalline silicon (poly) is deposited on the surface of the semiconductor wafer, heavily doped with a dopant such as POC13 at a dose of approximately $10^{21}$ atoms/cm$^2$, patterned and etched to form conductive poly gates 52 and 54. Poly gate 52 extends from a point near the lateral margin of the source region 34, over the IGFET body 30, across a near area of the drift region 26. and preferably up onto a portion of the LOCOS oxide region 42. Poly gate 54 is disposed similarly in mirror image.

Figure 5:
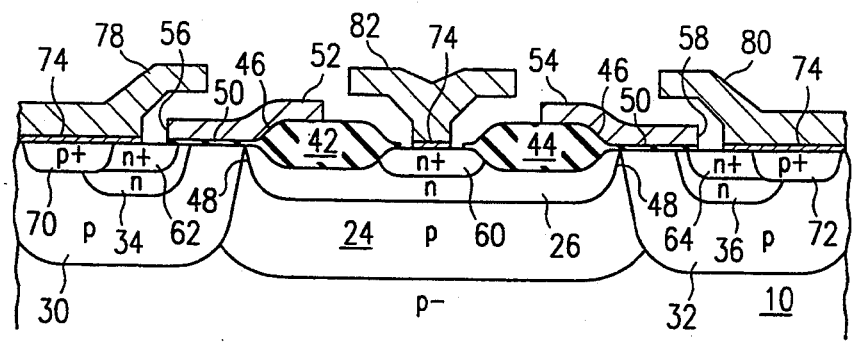

The remaining important steps in the fabrication process are illustrated in FIG. 5. An (N+) source/drain implant is performed as partially self,aligned to lateral edges 56 and 58, respectively, of the poly gates 52 and 54. A developed photoresist layer 59 (see FIG. 4) is used to define the opposing lateral margins of the implant. This first (N+) source/drain implant is performed, for example, with phosphorus, at an energy of approximately 80 KeV and a dose of approximately $4 \times 10^{14}$ cm$^{-2}$. This implant enhances the dopant concentration in source regions 34 and 36, and creates the drain region 60, which is self-aligned to LOCOS islands 42 and 44. This first source/drain implant is immediately followed with a second source/drain implant with, for example, arsenic at an implantation energy of approximately 120 KeV and a dose of $5 \times 10^{15}$ atoms/cm$^2$. This will create particularly heavily doped (N+) regions 62 and 64, and will enhance the dopant concentration of the drain 60. Regions 62 and 34 form a graded-junction source region, as do regions 36 and 64 correspondingly.

Next, a (P) implant area is defined using photoresist, and an implant of a (P) type dopant, as for example boron, is performed to create (P+) back gate connection regions 70 and 72. The back gate connection regions may be formed, for example, with boron at an implantation energy of about 25 KeV and a dose of about $2 \times 10^{15}$ atoms/cm$^2$. These back gate connection regions 70 and 72 are implanted within the respective IGFET bodys 3C and 32, and preferably are adjacent to their respective source regions 62 and 64. This is to make efficacious a common metal contact (not shown) to both the source region 62 and the back gate connection 70, on the one hand, and to the source region 64 and the back gate connection 72 on the other.

Further steps are necessary to complete the device. These include the deposition of approximately 4000 Angstroms of undoped oxide and approximately 7000 Angstroms of borophosphosilicate glass (BPSG) (not shown). A contact photoresist layer (not shown) is then deposited and developed. Appropriate contacts are etched to expose at least portions of back gate connection regions 70 and 72, source regions 62 and 64, and drain region 60. The exposed contact areas are silicided by depositing platinum, which will create a thin layer 74 of platinum silicide. Excess platinum is then removed. This is followed by the deposition of a relatively refractory metal such as a titanium-tungsten alloy. The first level of metallization is completed using aluminum to complete contacts 78, 80 and 82.

Figure 6:
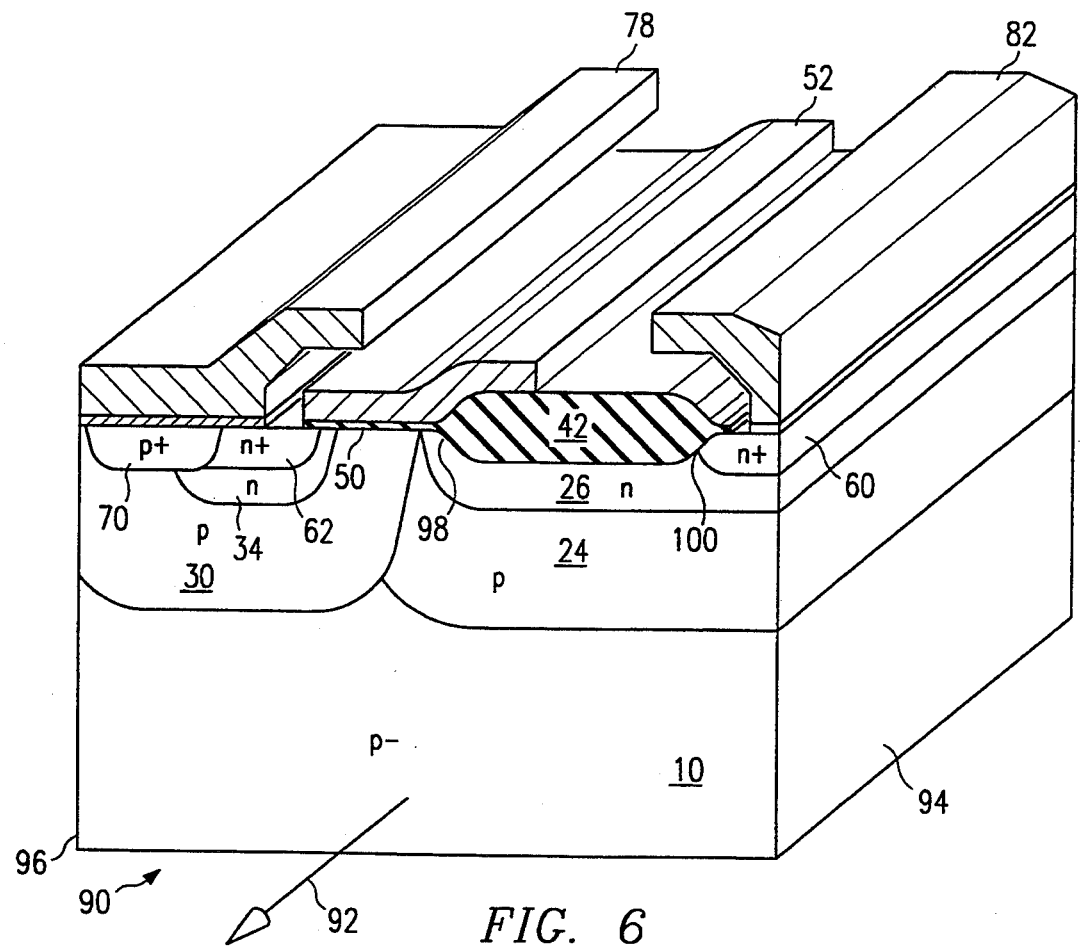
FIG. 6 is a perspective view of a portion of one such LDMOS transistor.

FIG. 6 is a highly magnified, schematic perspective view of the left one-half of the pair of devices shown in FIG. 5. The completed lateral double-diffused "metal-/oxide/semiconductor" (LDMOS) power transistor indicated generally at 90 may take any of several forms. The indicated structures may be elongated indefinitely in parallel to direction 92 to create a series of elongate stripes, as current-carrying characteristics require. Also, as is partially shown conjunction with FIGS. 1-5, the transistor 90 may be replicated about planes 94 and 96, and repeated in this manner as many times as is desired. With multiple sources and drains, drain region 60 would alternate with source region 34. Only one such alternation is shown conjunction with FIGS. 1-5, which shows a common drain region 60 provided for the source regions 34 and 36. The basic structure of transistor 90 may also have curved components (not shown) such that an essentially circular structure may be fabricated; curved components (net shown) can also close off and join together appropriate ones of the "stripes" at either end of an elongated structure.

Silicon has a breakdown voltage characteristic of approximately 30 volts per micron. For a structure designed to have a breakdown voltage (BV) of approximately 90 volts, the length, in a direction perpendicular to direction 92, of the drift region 26 from a lateral margin 98 of the LOCOS oxide 42 to the lateral margin 100 of the drain 60 should be approximately 3.5 microns. This distance may be reduced for devices needing lower breakdown voltages. The distance between points 98 and 100 directly affect the on-resistance, $r_{ds}(on)$. It is desirable to increase the dopant of drift region 26 to lower the on-resistance as much as possible. On the other hand, the breakdown voltage of the part will depend in part on the relationship of the dopant concentration $N_d$ of the drift region 26 and the dopant concentration of $N_a$ of the JFET gate region 24. As the concentration $N_a$ in gate region 24 is increased, the dopant concentration $N_d$ in drift region 26 may also be increased while meeting the RESURF conditions. This allows more flexible design, and an optimization of $r_{ds}(on)$ and the breakdown voltage (BV).

For a relatively light arsenic dose of region 26, the breakdown voltage is caused by potential crowding near the (N+) drain 60. In this mode, breakdown voltage increases with the arsenic implant dose. With higher arsenic implant doses, a bulk breakdown is observed. This is the preferred mode of operation since the device 90 will then exhibit the highest possible breakdown voltage and the bulk breakdown gives the device 90 more rugged characteristics. However, further increases in the arsenic implant dose result in lower breakdown voltage due to the high electric fields under the gate electrode 52. After a point, this lowering in breakdown voltage outweighs the incremental improvement in $r_{ds}(on)$.

LDMOS devices 90 suitable for automotive applications were fabricated in a one micron CMOS process. The smallest call scale pitch (between planes 94 and 96) was 10.7 microns. The measured $r_{ds}(on)$ of 1.38 milliohms-cm$^2$ at a $V_{gs}$ of 15 volts with a breakdown voltage of 80 volts represents the best performance reported to date for a lateral device in this voltage range.

In summary, an improved performance LDMOS power transistor has been shown and described. The addition of an enhanced-dopant concentration JFET gate region allows the dopant concentration of the drift region to be increased, thereby reducing $r_{ds}(on)$, important in the characterization of the performance of the device. Nonetheless, this device may be fabricated such that it is compatible with the VLSI logic process at a minimal extra cost and only one additional mask.

While preferred embodiments have been described and illustrated in conjunction with the above detailed description and the appended drawings, the invention is not limited thereto, but only by the scope and spirit of the appended claims.

What is claimed is:

1. A method of fabricating a power transistor at a face of a semiconductor layer having a first conductivity type, comprising the steps of:

forming a mask on the face to define a first implant area;

using the mask, selectively implanting a dopant of a second conductivity type into the implant area;

using the mask, selectively implanting a dopant of the first conductivity type into the implant area, the dopant of the first conductivity type having substantially higher diffusivity in the semiconductor layer than the dopant of the second conductivity type;

driving in the dopants to create a drift region of the second conductivity type and a JFET gate region of the first conductivity type laterally and downwardly surrounding the drift region;

forming a source region to be of the second conductivity type and to be spaced from the drift region;

forming an IGFET body of the first conductivity type, at least a portion of the IGFET body spacing the source region from the drift region;

forming at least one thick insulator layer on a portion of the drift region near a boundary thereof with the IGFET body;

forming a gate insulator on the IGFET body and to extend on the face from the source region at least to the thick insulator region;

forming a conductive gate at least on the gate insulator; and forming a drain region of the second conductivity type and to be spaced from the IGFET body by the drift region.

2. The method of claim 1, wherein said step of forming the source region and forming the IGFET body comprise the steps of:

using a second mask to define a body region/source region implantation area;

using the second mask, selectively implanting a dopant of the first conductivity type into the body region/source region implantation area;

using the second mask, selectively implanting a dopant of the second conductivity type into the body region/source region implantation area, the dopant of the second conductivity type having substantially less diffusivity in the semiconductor layer than the dopant of the first conductivity type; and driving in the dopants implanted using the second mask to create a source region spaced from the drift region and an IGFET body laterally and downwardly surrounding the source region.

3. The method of claim 1, and further comprising the steps of:

forming the IGFET body to laterally and downwardly surround the source region and to overlap the JFET gate region; and forming a back gate connection region at the face to be of the first conductivity type and to adjoin the IGFET body.

4. The method of claim 1, and further comprising the steps of:

using an edge of the conductive gate to partially self-align the implant, implanting additional dopant of the second conductivity type into the source region in order to create a graded junction.

* * * * *